United States Patent [19]

Semones et al.

[11] Patent Number: 5,293,131
[45] Date of Patent: Mar. 8, 1994

[54] CAPACITIVE PROBE FOR BORE MEASUREMENT

[75] Inventors: Timothy D. Semones, Atlanta; Carl E. Price, Marietta, both of Ga.

[73] Assignee: Measurement Systems, Inc., Marietta, Ga.

[21] Appl. No.: 940,627

[22] Filed: Sep. 4, 1992

[51] Int. Cl.⁵ .................................................. G01R 27/26
[52] U.S. Cl. ................................. 324/662; 324/661; 324/660; 324/687; 324/690; 340/870.37
[58] Field of Search ............... 324/660, 661, 662, 690, 324/687; 340/870.37

[56] References Cited

U.S. PATENT DOCUMENTS

| | | | |
|---|---|---|---|
| 4,112,355 | 9/1978 | Gibson, Jr. et al. | 324/662 |
| 4,168,465 | 9/1979 | Prince | 324/690 |
| 4,245,188 | 1/1981 | Rottman | 324/690 |
| 4,295,092 | 10/1981 | Okamura | 324/690 |
| 4,929,885 | 5/1990 | Deshman | 324/664 |

FOREIGN PATENT DOCUMENTS 3237594 4/1984 Fed. Rep. of Germany ...... 324/690

*Primary Examiner*—Kenneth A. Wieder
*Assistant Examiner*—Jose M. Solis
*Attorney, Agent, or Firm*—Deveau, Colton & Marquis

[57] ABSTRACT

A capacitive probe for inspecting and measuring the diameter of a bore and thus the amount of wear in the bore formed of an electrically insulated housing containing two levels of conductive plates to measure distance between the plates and the rifling grooves and lands of a bore.

4 Claims, 4 Drawing Sheets

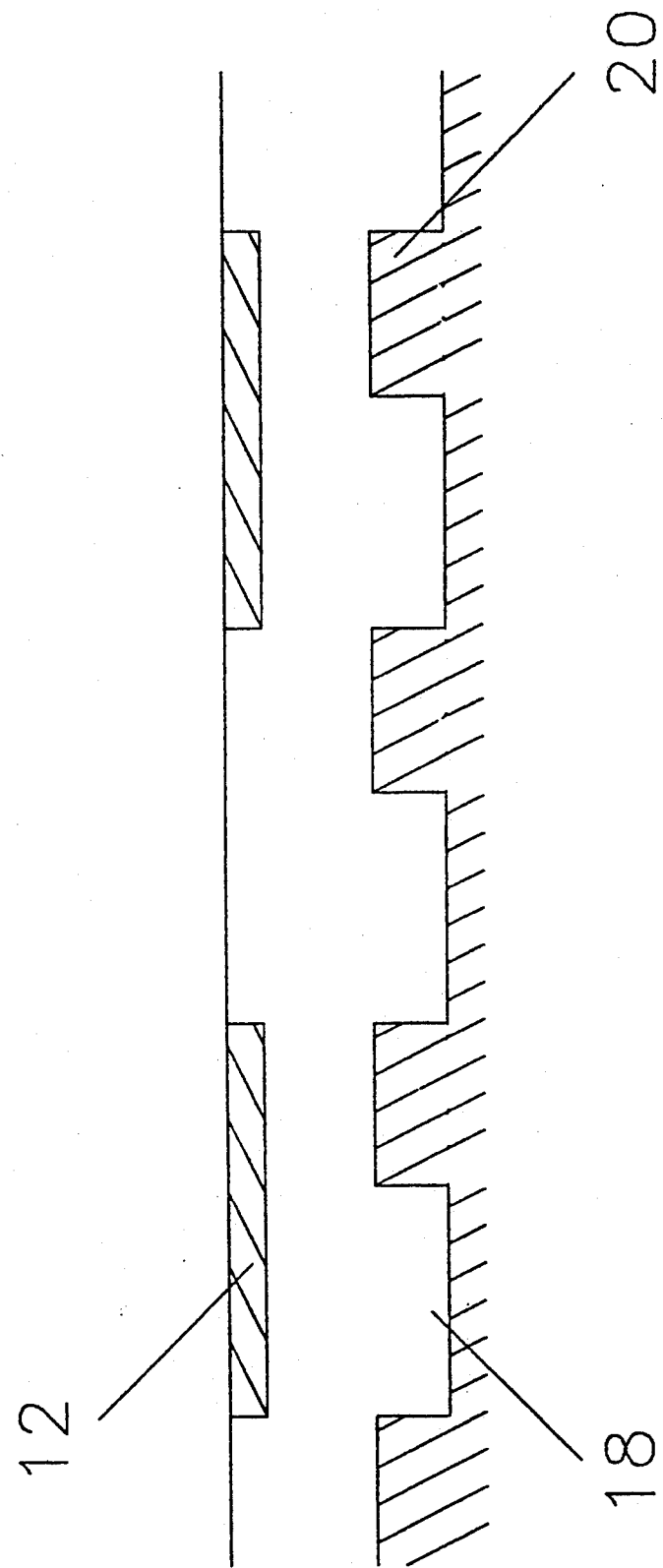

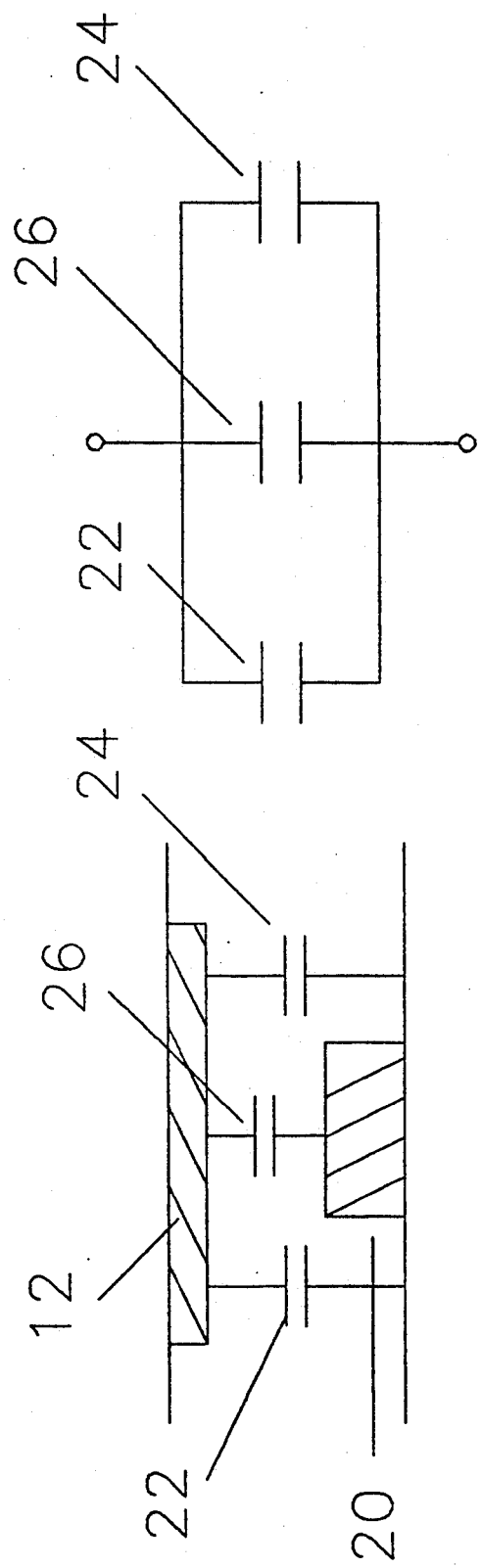

CAPACITIVE PROBE FOR BORE MEASUREMENT

BACKGROUND OF THE INVENTION

1. Field of the Invention

This invention relates generally to a capacitive probe for inspecting and measuring the amount of wear in a bore at specific locations along the axis of the bore, and specifically a capacitive probe for inspecting and measuring the wear of the rifle lands in relation to the grooves in a bore.

2. Prior Art

The bore of a gun barrel is machined so that the inner surface of the bore is grooved. These grooves are further machined spirally so as to impart an axial rotating motion to a projectile when discharged from the weapon. When so designed, the grooves carve out lands, the raised sections between grooves. When viewed in cross section, the grooves and lands are typically of equal height and number.

The dimensions and structural integrity of the spiral rifling, comprising the grooves and the lands, of a gun barrel are critical to maintaining accurate and precise operation of the weapon and projection of the projectile. However, through prolonged and hard use, the lands may become worn due to friction, erosion, dirt, exposure to the elements, etc. These problems are particularly of concern with automatic-fire weapons. When the lands become worn, the effectiveness and safety of the weapon are compromised. For example, axial rotation imparted to the projectile is decreased, causing the projectile to travel more slowly or to "knuckle-ball". In fighter aircraft, this may create a major problem, as the aircraft may be traveling faster than the projectile, catch up to the projectile, and damage itself.

At present, there is no fast, convenient, accurate, and precise means of assessing the amount of wear in a gun barrel bore. Visual inspection of the gun barrel is one means of assessing the amount of bore wear. However, a significant amount of wear may occur before one is able to visually detect bore wear, for example, by the presence of slick spots in the bore. Actual weapon operation provides another means of determining the potential presence of worn lands. However, this approach, at best, only alerts one to the possibility of worn lands.

An inner micrometer or other measurement gauge provides the best currently available means of measuring the diameter of a gun barrel bore at various points along the axis of the bore. However, this mechanical measurement technique is limited in accuracy due to the necessity of human input to properly align the gauge.

U.S. Pat. No. 4,168,465 to Prince teaches the use of capacitive probes for inspection and measuring defects in fastener holes, namely a tapered capacitive probe for detecting irregular flaws in metal holes. However, that invention is directed to objects which have a relatively smooth surface and is not capable of accurately measuring the amount of wear in a grooved surface. That is, it is incapable of accurately measuring the land-groove disparity.

SUMMARY OF THE INVENTION

The present invention involves a capacitive probe for measuring the rifling in the bore of a gun barrel or other cylindrically-shaped metal object. The probe consists of an elongated shaft suitable for non-destructive, telescopic insertion into the barrel of a gun. The interior of the probe houses an array of capacitor plates which are used to measure the distance between the capacitor plates and the rifling lands/grooves with appropriate electronic circuitry known by those skilled in the art.

The capacitor plates are positioned around the circumference of the broad end of the probe at at least one level, but preferably two levels. When two levels of capacitor plates are used, one level of capacitor plates is located on one side of a line perpendicular to the longitudinal axis of the barrel while the other level is located on the other side of such a line. So arranged, the capacitor plates form a side-by-side, longitudinally alternating pattern about the circumference of the broad end of the probe.

The capacitive probe of the present invention is encapsulated in an electrically insulated material and is unaffected by contact with most contaminants associated with the airline industry such as grease, hydraulic fluid, oil, de-icing fluid, fire extinguishant, etc.

It is an object of the present invention to provide an improved means of measuring the wear in gun barrel bores at specific locations along the axis of the bore.

It is another object of the invention to provide a capacitive probe for measuring the distance between the capacitive plates of the probe and a cylindrically-shaped grooved surface in which the probe is inserted.

It is still another objective of this invention to provide a capacitive probe capable of measuring distances to a high degree of accuracy.

Still another object of the present invention is to provide a capacitive probe suitable for manual or automatic insertion into gun barrels.

Another object of this invention is to provide a sturdy, electrically sealed, shock-proof capacitive probe.

Yet another object of the invention is to provide a capacitive probe which is lightweight and easily operated.

These and other advantages, features, and objects of the invention will become apparent from the following detailed description of a preferred embodiment when read in conjunction with the attached figures.

BRIEF DESCRIPTION OF THE DRAWINGS

FIG. 3 is a linear diagram of the capacitor plates of the present invention aligned over the land/groove surface of a gun barrel bore;

FIG. 4 is a linear diagram of one capacitor plate over a rifling land with associated capacitive values measured by the probe of the present invention; and FIG. 5 is a circuit diagram of the capacitive values measured by the probe of the present invention.

DETAILED DESCRIPTION OF THE PREFERRED EMBODIMENT

Figure 1:
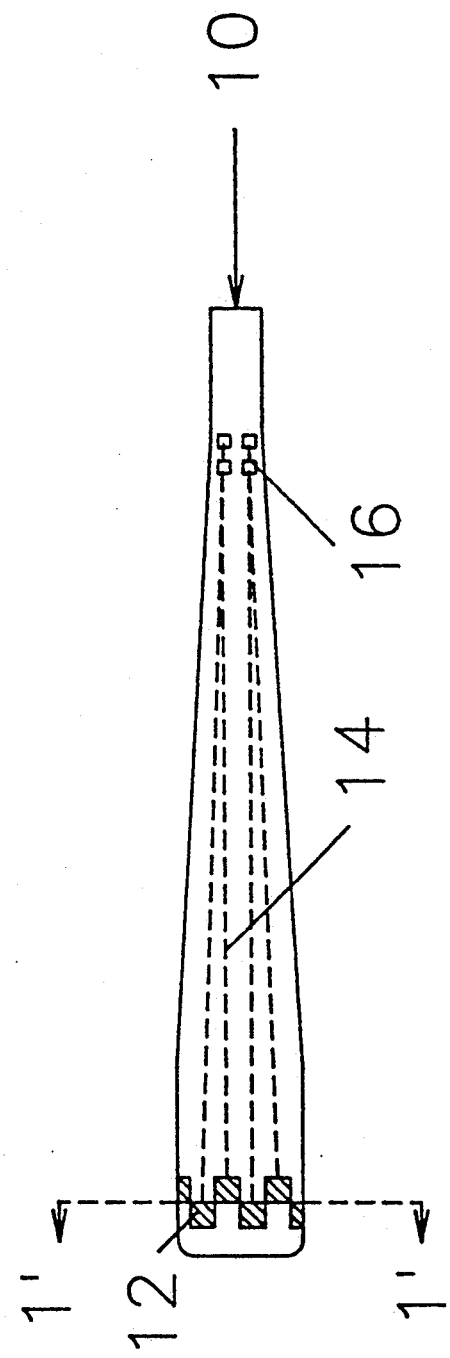
FIG. 1 is a side cross-section of the preferred embodiment of the capacitive probe of the present invention.

Referring now to FIGS. 1-5, wherein like numerals represent like parts, the capacitive probe of the present invention is indicated generally by the number 10. With reference now to FIG. 1 depicting the preferred embodiment of the present invention, the capacitive probe 10 comprises capacitor plates 12, conductive traces 14, and connection pads 16 enclosed in an electrically insulated housing. The probe has two rows of capacitor plates 12 located adjacent to each other along the length of the probe 10. The total number of capacitor plates equals the number of lands (or grooves) in the rifle bore, with half of the total number of capacitor plates located in each level. For example, for a rifle bore having 16 lands and 16 grooves each level would consist of eight capacitor plates positioned around the circumference of the probe, for a total of 16 capacitor plates. The axial width (along the circumference) of each plate is chosen to be equal to the sum of the width of a rifling groove 18 and a rifling land 20.

For example, for applications requiring an embodiment of the present invention capable of measuring the diameter along a parallel bore of nominal 25 or 27 millimeter caliber at intervals of 100 millimeters along a nominal barrel length of 1700 millimeters, such as for use on guns fitted to military aircraft which have a 16 land/groove rifling, the above-described 8 capacitor plate per layer embodiment is suitable.

Figure 2:
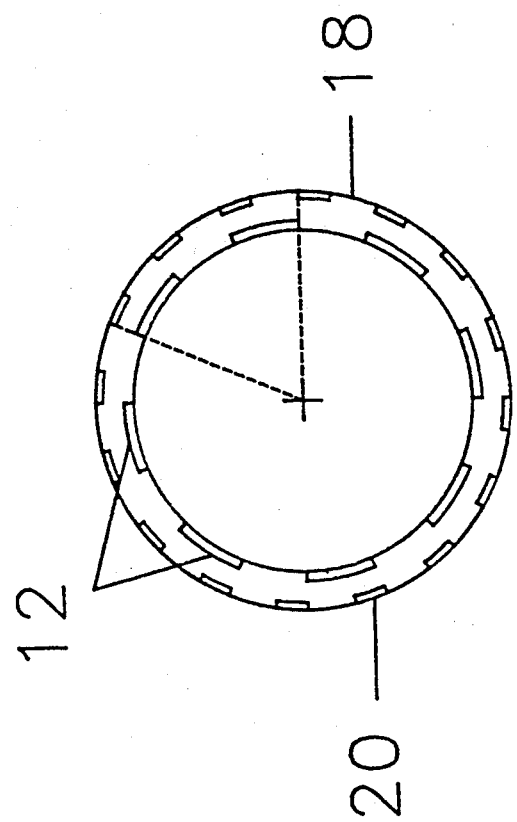
FIG. 2 is a front cross-section view of the probe of the present invention taken along line 1'-1' of FIG. 1 as inserted in a gun barrel.

With reference now to FIG. 2, a cross section view of one level of capacitor plates 12 positioned in a gun barrel 28 is depicted. In the cross-section shown in the example of FIG. 2, there are sixteen separate rifling lands 20 and sixteen separate rifling grooves 18. With the two levels of capacitor plates 12, the probe will position each plate to measure over one land-width in each 22.5° (360°/16) section of the bore. One level of eight plates will measure at 0°–22.5°, 45°–67.5°, 90°–112.5°, etc. The other level of eight plates will measure at 22.5°–45°, 67.5°–90°, 112.5°–135°, etc.

FIG. 3 illustrates a linear view of two capacitor plates 12 positioned above rifling grooves 18 and rifling lands 20. It is important to note that the capacitive probe 10 always positions each capacitor plate 12 directly over a combined width of exactly one full rifling land 20 and one full rifling groove 18. It is not necessary that the capacitive probe 10 position the capacitor plates 12 so as to line up directly with a single land and a single groove. Rather, the capacitor plates 12 may be aligned over one full rifling land 20 and portions of two rifling grooves 18 as depicted in FIG. 4, or vice versa, and still produce accurate measurements.

Appropriate electronic circuitry, known by those skilled in the art, such as a capacitive measuring system of convential design and which is currently available on the open market such as those available from Measurement Systems Incorporated of Marietta, Ga., places a voltage on each capacitor plate 12, one at a time, which results in a discharge waveform when connected to an accurate series resistance. A comparator may be used to gate a counting circuit to measure the time required for the discharge waveform to pass through two threshold voltages. This measured time is related to electrical capacitance, and thus to the distance between the capacitor plates 12 and the bore surface.

Referring now to FIGS. 4 and 5, a capacitor plate 12 positioned over a rifling land/groove along with the associated electrical equivalent circuit is shown. The information required to calculate the distance from the capacitor plate 12 of the capacitor probe 10 to the land 20 (and thus the bore diameter) is contained in land capacitance 26, $C_{land}$, the capacitance between the portion of the capacitor plate 12 which opposes the land 20. The actual capacitance measured is a combination of the capacitance between the capacitor plate 12 and the groove surfaces, and the capacitance between the capacitor plate 12 and the land 20. Element 22 represents the capacitance measured between capacitor plate 12 and one adjacent groove surface 22, $C_{groove\ 1}$, and element 24 represents the capacitance measured between capacitor plate 12 and the other adjacent groove surface 24, $C_{groove\ 2}$. Typically, the capacitor plate 12 will not center exactly over one land 20 and one groove 18, but will center over either one land 20 and portions of the two adjacent grooves 18, or one groove 18 and portions of the the two adjacent lands 20. If the capacitor plate 12 does center over one groove 18 and one land 20, the $C_{land}$ can be measured by subtracting the $C_{groove}$ from the $C_{measured}$ ($C_{land} = C_{measured} - C_{groove}$). However, if the capacitor plate centers over one land 20 and portions of two grooves 18, the $C_{land}$ can be measured by subtracting the $C_{groove}$ of both grooves from the $C_{measured}$ ($C_{land} = C_{measured} - C_{groove\ 1} - C_{groove\ 2}$). Accordingly, the capacitance between the capacitor plates 12 and the groove surfaces can be determined mathematically from the actual capacitance measurements according to one of the following equations:

$$C_{land} = C_{measured} - C_{groove} \qquad (1)$$

$$C_{land} = C_{measured} - C_{groove\ 1} - C_{groove\ 2}. \qquad (2)$$

These equations may be used to calculate the capacitance between the lands 20 and the probe 10 at each of the 16 measurement locations in one axial bore position from which the bore diameter, and thus the bore wear can be determined.

In operation, a gun barrel bore is inspected by attaching the capacitive probe 10 to a light-weight telescoping tube mechanism that incorporates positive stops at various indexing points Another approach utilizes a steel tape that feeds in the barrel from a coiled position. Positive stops on the angular position of the coil drum establish the precise position of the tape and subsequently the probe position in the barrel. The positive stops of either approach insure indexing at selected intervals along the barrel length.

A set of capacitive readings is taken at each indexing point to determine the capacitance between each capacitor plate 12 and the gun barrel bore. Electrical capacitance is used as a tranducer function to measure distance. Two basic principles are employed by this measurement system. The first principle is that the capacitance between two parallel plates is inversely proportional to their separation distance. The second principle pertains to the manner in which a voltage placed across an electrical capacitance will discharge through a series resistance. Commerically available electronics place a voltage on each capacitor plate 12, one at a time. This results in a discharge waveform through an accurate series resistance. A comparator is used to gate a counting circuit to measure the time required for the discharge waveform to pass through two threshold voltages. This measured time is related to electrical capacitance, and thus to the distance between the capacitor plates 12 and the gun barrel bore.

The capacitive probe for gun barrel bore measurement of the present invention provides a system which will measure and monitor wear in gun barrel bores at specific locations along the longitudinal axis of the bore. While the above description contains many specifics, it will be obvious to those skilled in the art that many variations may be made in the embodiment chosen for the purpose of illustrating the best mode of making and using the present invention without departing from the scope thereof. Accordingly, the scope of the invention should be determined not by the embodiment illustrated, but by the appended claims

What is claimed is:

1. A capacitive probe for measurement of a bore having a plurality of lands and grooves, comprising:
    an elongated, generally cylindrically shaped housing formed of an electrically insulating material comprising a proximal end for insertion into a bore;
    a plurality of electrically conductive plates affixed around the circumference of the housing, said plates alternating at one of two distances from the proximal end of the housing and being electrically isolated from each other; and
    means for connecting said plates to a data receiving means.

2. The capacitive probe as recited in claim 1, wherein the length of each of said plates measured along the circumference of the housing is equal to a multiple of the combined length of one of said lands and one of said grooves of the bore being measured.

3. The capacitive probe as recited in claim 1, wherein said plates are located on the surface of said housing equidistant from the longitudinal axis of said housing.

4. A capacitive probe for measurement of a bore having a plurality of lands and grooves, comprising:
    an elongated, generally cylindrically shaped housing formed of an electrically insulating material comprising a proximal end for insertion into a bore;
    a plurality of electrically conductive plates affixed around the circumference of the housing, said plates being electrically isolated from each other and having a length, measured along the circumference of said housing, equal to a multiple of the combined length of one of said lands and one of said grooves; and
    means for connecting said plates to a data receiving means.

* * * * *